United States Patent
Chen

(10) Patent No.: US 9,498,799 B2
(45) Date of Patent: Nov. 22, 2016

(54) METHOD FOR REMOVING NON-BONDING COMPOUND FROM POLYCRYSTALLINE MATERIALS ON SOLAR PANEL

(71) Applicant: TSMC SOLAR LTD., Taichung (TW)

(72) Inventor: Shih-Wei Chen, Kaohsiung (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 276 days.

(21) Appl. No.: 14/203,592

(22) Filed: Mar. 11, 2014

(65) Prior Publication Data
US 2015/0258581 A1    Sep. 17, 2015

(51) Int. Cl.
*B08B 3/04*    (2006.01)
*B08B 3/10*    (2006.01)
*H01L 31/18*   (2006.01)

(52) U.S. Cl.
CPC ............... *B08B 3/044* (2013.01); *B08B 3/10* (2013.01); *H01L 31/18* (2013.01)

(58) Field of Classification Search
CPC .......... B08B 3/044; B08B 3/10; H01L 31/18
USPC .................. 134/18, 26, 28, 29, 42
See application file for complete search history.

(56) References Cited

U.S. PATENT DOCUMENTS

| | | | |
|---|---|---|---|
| 5,415,698 A | 5/1995 | Fujinaga et al. | |
| 2006/0042756 A1 | 3/2006 | Miyazaki et al. | |
| 2011/0020971 A1* | 1/2011 | Sun | B01J 19/0046 438/57 |
| 2012/0031428 A1* | 2/2012 | Cheng | B08B 1/04 134/6 |
| 2014/0000649 A1* | 1/2014 | Deshmukh | H01L 21/6704 134/3 |

* cited by examiner

*Primary Examiner* — Saeed T Chaudhry
(74) *Attorney, Agent, or Firm* — Duane Morris LLP

(57) ABSTRACT

A method for removing non-bonding compounds from absorber layers of a plurality of absorber substrates during a cleaning process comprises setting one or more conditions of a solution in a solvent tank used to clean the non-bonding compounds from the absorber layers of the absorber substrates. The method further comprises calculating thickness of boundary layers formed on the absorber layers based on hydrodynamics of the solution in the solvent tank during the cleaning process, and setting one or more of spacing between the absorber substrates and circulation speed of the solution in the solvent tank during the cleaning process. The method further comprises immersing and cleaning the absorber substrates in the solvent tank under one or more of the set conditions, spacing and circulation speed of the solution.

14 Claims, 4 Drawing Sheets

METHOD FOR REMOVING NON-BONDING COMPOUND FROM POLYCRYSTALLINE MATERIALS ON SOLAR PANEL

PRIORITY CLAIM AND CROSS-REFERENCE

None.

BACKGROUND

This disclosure is related to cleaning of solar cells during fabrication. Solar cells are electrical devices for generation of electrical current from sunlight by the photovoltaic (PV) effect. Each solar cell has one or more layers (thin films) of PV materials such as polycrystalline materials deposited on a substrate. The thickness of the PV materials can be on the order of nanometers or micrometers.

Polycrystalline materials are solid materials composed of many crystallites of varying size and orientation. The variation in direction can either be random or directed, due to various growth and processing conditions. The crystallites are often referred to as crystallite grains or grains, which are formed in the polycrystalline materials when the polycrystalline materials are cooled during fabrication. The areas where these grains meet are known as grain boundaries.

Examples of polycrystalline materials used as absorber layers in solar panels include copper indium gallium selenide (CIGS) and cadmium telluride. Absorber layers absorb light for conversion into electrical current. Solar panels also include front and back contact layers to assist in light trapping and photo-current extraction and to provide electrical contacts for conducting the generated current across the solar panel. The front contact typically comprises a transparent conductive oxide (TCO) layer. The TCO layer transmits light through to the absorber layer and conducts current in the plane of the TCO layer. In some systems, a plurality of solar cells are arranged adjacent to each other, with the front contact of each solar cell conducting current to the next adjacent solar cell.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
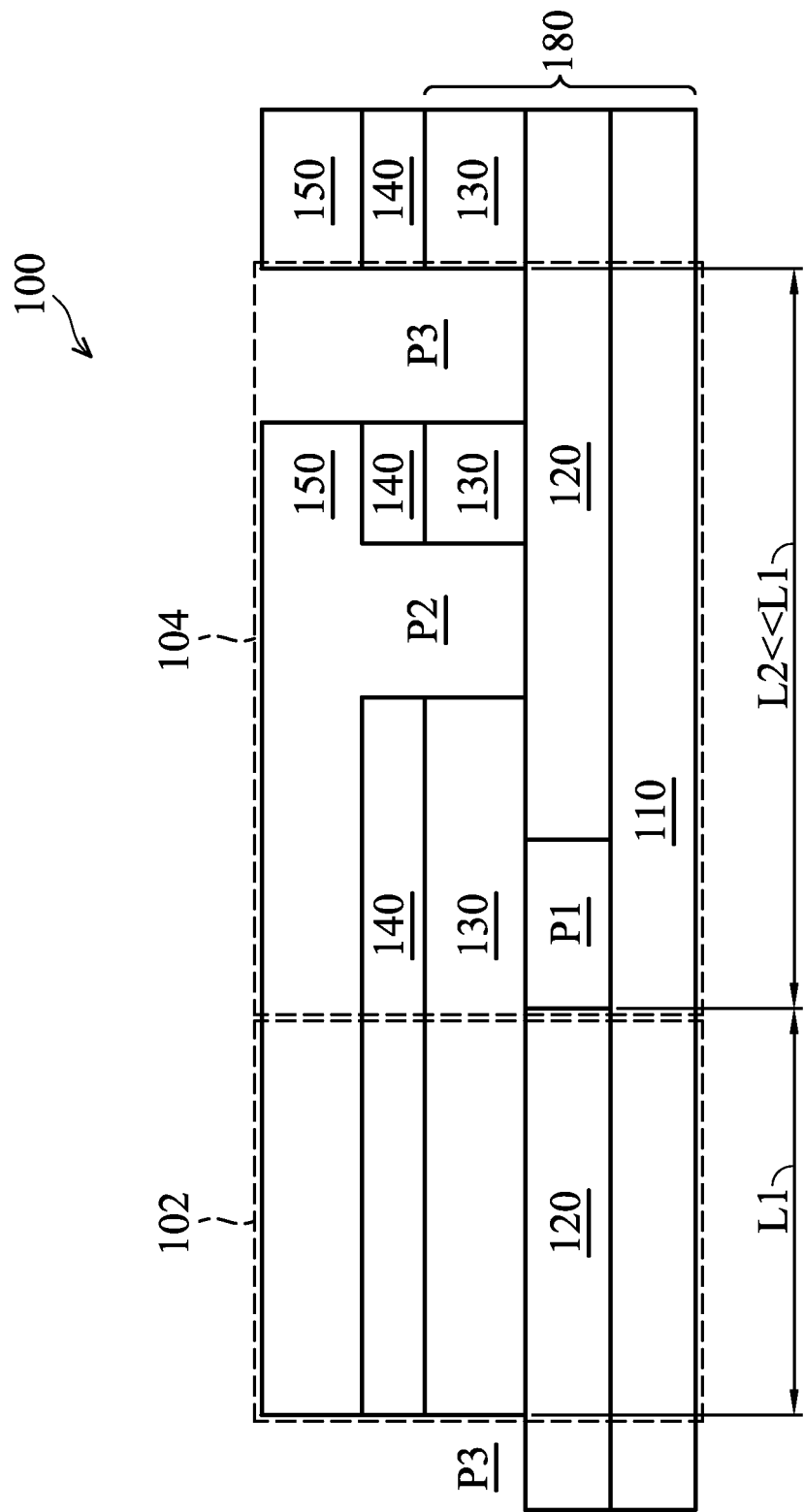
FIG. 1 is a cross sectional view of a solar panel, in accordance with some embodiments.

The following disclosure provides many different embodiments, or examples, for implementing different features of the subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In this disclosure and the accompanying drawings, like reference numerals indicate like items, unless expressly stated to the contrary.

As discussed above, there are many areas formed at grain boundaries of polycrystalline materials on a thin film/layer of a solar panel/cell. These areas tend to trap certain kinds of atoms and/or compounds during the formation process of the polycrystalline materials. These residual compounds at the grain boundaries are undesirable since they may hurt the performance of the device. For a non-limiting example, a CIGS absorber layer may have grains of various shapes and sizes (large and/or small), and many non-bonding compounds may form at the boundaries of these grains of irregular shapes and sizes. For another non-limiting example, Na diffusion into an absorber layer reduces defects when Soda-Lime Glass (SLG) and/or Health Stone Glass (HSG) are used as a substrate. As a result, Na compounds such as $Na_2Se$ and/or $Na_2S$ may accumulate at the grain boundaries of a CIGS absorber layer.

This disclosure describes an approach to remove non-bonding compounds located and accumulated at grain boundaries of polycrystalline materials on an absorber layer of an unfinished solar panel. The approach extracts and removes the non-bonding compound(s) from the grain boundaries through a wet solution treatment process during a fabrication process of the solar panel. First, conditions of the solution used for the solution treatment are determined and set, wherein the conditions include but are not limited to, content, pH value, and temperature of the solution. Then, the absorber layer is processed through a fluid hydrodynamic process, which cleans up the non-bonding compounds using a hydraulic flow of the solution under the set conditions. The fabrication process of the solar panel continues after the absorber layer of the solar cell is cleaned.

FIG. 1 is a cross sectional view of a solar module 100 according to some embodiments. The solar cell 100 includes a solar cell substrate 110, a back contact layer 120, an absorber layer 130, a buffer layer 140 and a front contact layer 150.

Substrate 110 can include any suitable substrate material, such as glass. In some embodiments, substrate 110 includes a glass substrate, such as soda lime glass, or a flexible metal foil or polymer (e.g., a polyimide, polyethylene terephthalate (PET), polyethylene naphthalene (PEN)). Other embodiments include still other substrate materials.

Back contact layer 120 includes any suitable back contact material, such as metal. In some embodiments, back contact layer 120 can include molybdenum (Mo), platinum (Pt), gold (Au), silver (Ag), nickel (Ni), or copper (Cu). Other embodiments include still other back contact materials. In some embodiments, the back contact layer 120 is from about 50 nm to about 2 μm thick.

In some embodiments, absorber layer 130 includes any suitable absorber material, such as a p-type semiconductor. In some embodiments, the absorber layer 130 can include a chalcopyrite-based material comprising, for example, one or more of $Cu(In,Ga)Se_2$ (CIGS), cadmium telluride (CdTe), $CuInSe_2$ (CIS), $CuGaSe_2$ (CGS), $Cu(In,Ga)(Se,S)_2$ (CIGSS), and amorphous silicon. Other embodiments include still other absorber materials. In some embodiments, the absorber layer 140 is from about 0.3 μm to about 8 μm thick.

Buffer layer 140 includes any suitable buffer material, such as n-type semiconductors. In some embodiments, buffer layer 140 can include cadmium sulphide (CdS), zinc sulphide (ZnS), zinc selenide (ZnSe), indium (III) sulfide ($In_2S_3$), indium selenide ($In_2Se_3$), or $Zn_{1-x}Mg_xO$, (e.g., ZnO). Other embodiments include still other buffer materials. In some embodiments, the buffer layer 140 is from about 1 nm to about 500 nm thick.

In some embodiments, front contact layer 150 includes an annealed transparent conductive oxide (TCO) layer of constant thickness of about 100 nm or greater. The terms "front contact" and "TCO layer" are used interchangeably herein; the former term referring to the function of the layer 150, and the latter term referring to its composition. In some embodiments, the charge carrier density of the TCO layer 150 can be from about $1\times10^{17}$ cm$^{-3}$ to about $1\times10^{18}$ cm$^{-3}$. The TCO material for the annealed TCO layer can include suitable front contact materials, such as metal oxides and metal oxide precursors. In some embodiments, the TCO material can include AZO, GZO, AGZO, BZO or the like) AZO: alumina doped ZnO; GZO: gallium doped ZnO; AGZO: alumina and gallium co-doped ZnO; BZO: boron doped ZnO. In other embodiments, the TCO material can be cadmium oxide (CdO), indium oxide ($In_2O_3$), tin dioxide ($SnO_2$), tantalum pentoxide ($Ta_2O_5$), gallium indium oxide ($GaInO_3$), ($CdSb_2O_3$), or indium oxide (ITO). The TCO material can also be doped with a suitable dopant.

The layers 120, 130, 140 and 150 are provided in the collection region 102. Solar cell 100 also includes an interconnect structure 104 that includes three scribe lines, referred to as P1, P2, and P3. The P1 scribe line extends through the back contact layer 130 and is filled with the absorber layer material. The P2 scribe line extends through the buffer layer 150 and the absorber layer 140, and contacts the back contact 130 of the next adjacent solar cell. The P2 scribe line is filled with the front contact layer material forming the series connection between adjacent cells. The P3 scribe line extends through the front contact layer 160, buffer layer 150 and absorber layer 140. The P3 scribe line of the adjacent solar cell is immediately to the left of the solar cell collection region 102. In FIGS. 1-5, the width of the interconnect structure 104 is exaggerated relative to the width of the collection region 102 for clarity, but the collection region 102 is actually much larger than the interconnect structure. That is, the length L1 is much greater than the length L2. The collection region 102 and interconnect structure 104 alternate across the width of the solar panel.

When the solar cell 100 is exposed to light, charge carriers within the absorber layer 130 are released, and flow upward through the absorber layer 130 and buffer layer 140 to the front contact layer 150. The charge carriers in the front contact layer 150 flow to the right towards the interconnect structure. The current then flows downward through the P2 scribe line into the back contact layer 120 of the next adjacent solar cell 100.

As referred to hereinafter, an absorber substrate 180 is an unfinished solar cell or a module/panel having a plurality of unfinished solar cells, wherein the absorber substrate 180 includes the solar cell substrate 110, the back contact layer 120, and the absorber layer 130 formed during the fabrication process without the buffer layer 140 (and the front contact layer 150). The cleaning process described hereinafter is applied to the absorber substrate 180 during the fabrication process of the solar cell 100 after the absorber layer 130 has been formed but before the buffer layer 140 (and the front contact layer 150) has been applied, leaving the absorber layer 130 uncovered and exposed for cleaning. The cleaning process aims at extracting and removing non-bonding compounds from the grain boundaries of the polycrystalline materials of the absorber layer 130 in the absorber substrate 180.

Figure 2:
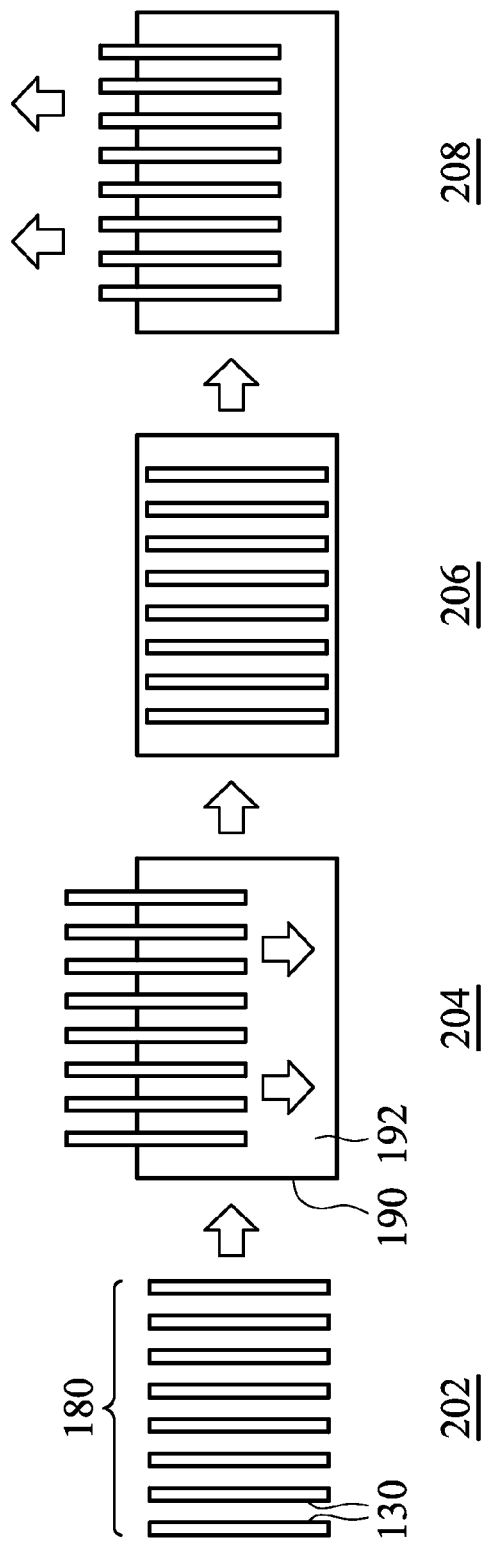
FIG. 2 is an example of a cleaning process that removes non-bonding compounds from the polycrystalline materials of the absorber layers on a plurality of absorber substrates, in accordance with some embodiments.

FIG. 2 is an example of a cleaning process that removes non-bonding compounds from the polycrystalline materials of the absorber layers 130 on one or more absorber substrates 180. As shown in FIG. 2, the plurality of absorber substrates 180 are organized as a batch at step 202. In some embodiments, the batch of the absorber substrates 180 can be arranged in pairs where the absorber layers 130 of each pair of the absorber substrates 180 are placed with their major faces parallel to each other, so that each substrate faces an adjacent substrate during the cleaning process. At step 204, the plurality of absorber substrates 180 are immersed in a solvent tank (e.g., water tank 190) filled with water solution 192 specifically set up to clean the absorber substrates 180. At step 206, the plurality of absorber substrates 180 are cleaned with the solution 192 while submerged in the water tank 190 under a hydrodynamic flow generated within the tank as discussed in details below. Once cleaned, the plurality of absorber substrates 180 are retrieved from the water tank 190 for the next step in the fabrication process of the unfinished solar cells (e.g., forming the buffer layers 140 of each substrate on top of the cleaned absorber layers 130).

In some embodiments, the residual/non-bonding compounds (e.g., $Na_2S$, $Na_2Se$, $Ka_2S$, $Ka_2Se$, etc.) accumulated on the grain boundaries on the absorber layers in a plurality of absorber substrates 180 typically have excellent solubility in water. In the example of $Na_2S$, the reaction formula is as follows:

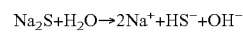

$$Na_2S + H_2O \rightarrow 2Na^+ + HS^- + OH^-$$

where the solution 192 will tend to become alkaline after the compound is dissolved in the solution.

In some embodiments, various parameters/conditions of the solution 192 are adjusted to increase the reaction rate between the non-bonding compounds and the solution 192 for fast removal of the non-bonding compounds during the cleaning process. Here, the parameters/conditions of the solution 192 include but are not limited to, content, pH value, and temperature of the solution 192.

In some embodiments, pH value of the solution 192 is set within the range of about 4 to about 7 with pH of 4 to 12 being an acceptable range. When the pH value of the solution 192 is lower than 7 (i.e., the solution 192 is acidic), OH generated from the dissolving reaction will be rapidly consumed by the solution 192, resulting in increase in the reaction rate. On the other hand, if the pH value of the solution 192 is too high, e.g., greater than 12, the solution 192 becomes alkaline, which leads to decrease in the reaction rate. As such, the pH value of the solution 192 is set to be acidic (e.g., pH value less than 7) or at least neutral (pH value is 7).

In some embodiments, the temperature of the solution 192 is set between the range of about 45° C.~about 75° C. with 25° C.~85° C. being an acceptable range. Since the reaction rate between the non-bonding compounds and the solution 192 increases with the temperature of the solution 192, the temperature of the solution 192 is set to a warm or warm to hot range (e.g., 45° C.~about 75° C.) to increase the reaction rate. On the other hand, if the temperature of the solution 192 is too high (e.g., greater than 85° C.), it may cause damage to the absorber substrate 180.

In some embodiments, one or more additional additives that are solvent are added into the solution 192 to reduce viscosity or surface energy of the solution 192. Here, the additive can be but is not limited to, ethanol, methanol, and isopropanol. The viscosity or surface energy of the solution 192 reflects the "thickness" and mobility of the solution 192. Since a "thinner" solution flows faster, which leads to faster reaction rate between the non-bonding compounds and the solution, reducing viscosity or surface energy of the solution 192 helps to accelerate the dissolution of the non-bonding compounds.

Figure 3:
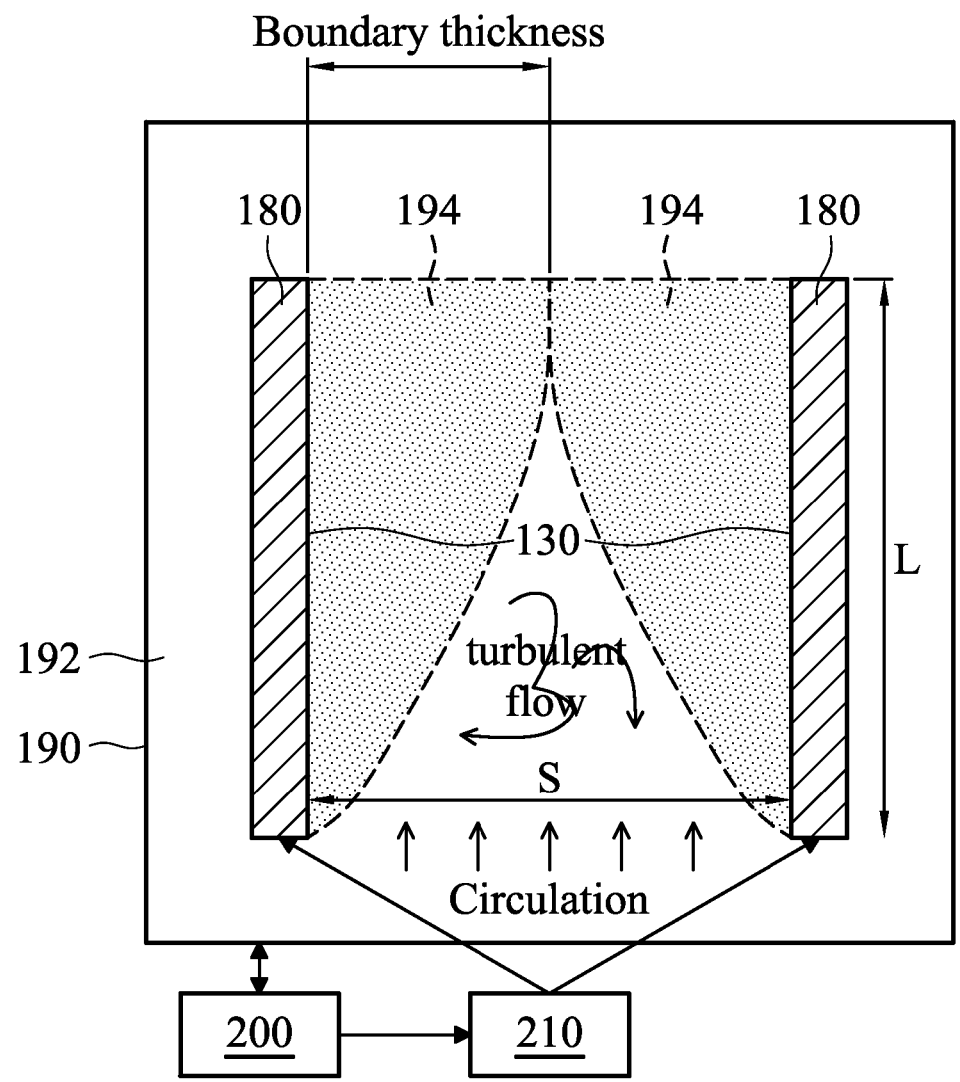
FIG. 3 depicts fluid hydrodynamics of the solution within a water tank during the clean process of a plurality of absorber substrates, in accordance with some embodiments.

In some embodiments, the effectiveness of the non-bonding compounds cleaning process is influenced not only by the parameters/conditions of the solution 192 discussed above, but also by fluid hydrodynamics of the solution 192 within water tank 190 during the cleaning process as depicted by the example of FIG. 3. Here, fluid hydrodynamics of the solution 192 include, but are not limited to, spacing between the absorber substrates 180, flow circulation speed of the solution 192, and boundary layer thickness of each absorber substrate 180 as discussed below.

In some embodiments, a pair of absorber substrates 180 are immersed in the solution 192 with their respective absorber layers 130 of polycrystalline materials facing each other as shown in the example of FIG. 3. During the cleaning process, a boundary layer 194 of liquid having thickness 6 is generated on each of the surfaces of the absorber layers 130 facing each other due to hydrodynamics of the circulation of the flow of the solution 192 in the tank 190. The diffusion (flow) of the solution 192 inside each of the boundary layers 194 is slow, while the flow of the solution 192 outside of the boundary layers 194 is much faster. Since fast flow of the solution 192 across the surface of the absorber substrate 180 increases the reaction rate between the non-bonding compounds on the surface of the absorber substrate 180 with the solution 192, reducing the thickness of the boundary layer 194 facilitates the cleaning process.

In some embodiments, the boundary layer thickness 6 is determined at least by one or more of solution density $\rho$ (kg/m$^3$), viscosity $\mu$ (m Pa·s), and flow circulation speed $u_0$ (m/s) of the solution 192 as well as length of the absorber substrates L. Specifically, the boundary layer thickness $\delta$ can be calculated using the equation below, $$\delta \approx \frac{4.91}{\sqrt{Re_x}} L$$

where Reynolds number $Re_x$ can be calculated using the equation below:

$$Re_x = \rho u_0 L / \mu$$

In the example where $\rho=1000$ kg/m$^3$, $\mu=1$ m Pa·s, $u_0=0.1$ m/s, and L=0.655 m, $Re_x=0.65*10^5$ and $\delta \approx 0.019$ L $\approx 1.24$ cm.

In some embodiments, the spacing S between the pair of absorber substrates 180 can be adjusted and set based on the boundary layer thickness 6 in order to speed up the cleaning process. When the spacing S is less than two times the boundary layer thickness 26, the boundary layers 194 of the two absorber substrates 180 facing each other will touch and overlap, resulting in reduced diffusion capability of the solution 192 between the absorber substrates 180 and thus reduced reaction rate between the non-bonding compounds on the absorber layers 130 and the solution 192. Thus, the spacing S between the absorber substrates 180 should be set to at least or greater than two times the boundary layer thickness 26 so that the solution 192 may flow quickly outside of the boundary layers 194 for a faster reaction rate between the non-bonding compounds on the absorber layers 130 and the solution 192.

Since the boundary layer thickness $\delta$ increases as the absorber substrate length L increases according to the equations above, in some embodiments, the spacing S between the absorber substrates 180 should also increase when the absorber substrate length L increases for faster cleaning of non-bonding compounds on the absorber layers 130. For a non-limiting example, the spacing S can be set to be greater than 0.038 L of the absorber substrate length according to the equations above.

Since the boundary layer thickness $\delta$ decreases as the circulation speed of the solution $u_0$ increases, in some embodiments, the circulation speed of the solution is increased to reduce boundary layer thickness $\delta$ and make the solution 192 flow faster for better clean result of the non-bonding compounds from the absorber layers 130. For a non-limiting example, if flow circulation speed $u_0$ increases from 0.1 m/s to 10 m/s, the boundary layer thickness $\delta$ will decrease from 1.24 cm to 0.124 cm, resulting in much faster flow of the solution 192 and a better cleaning result.

Figure 4:
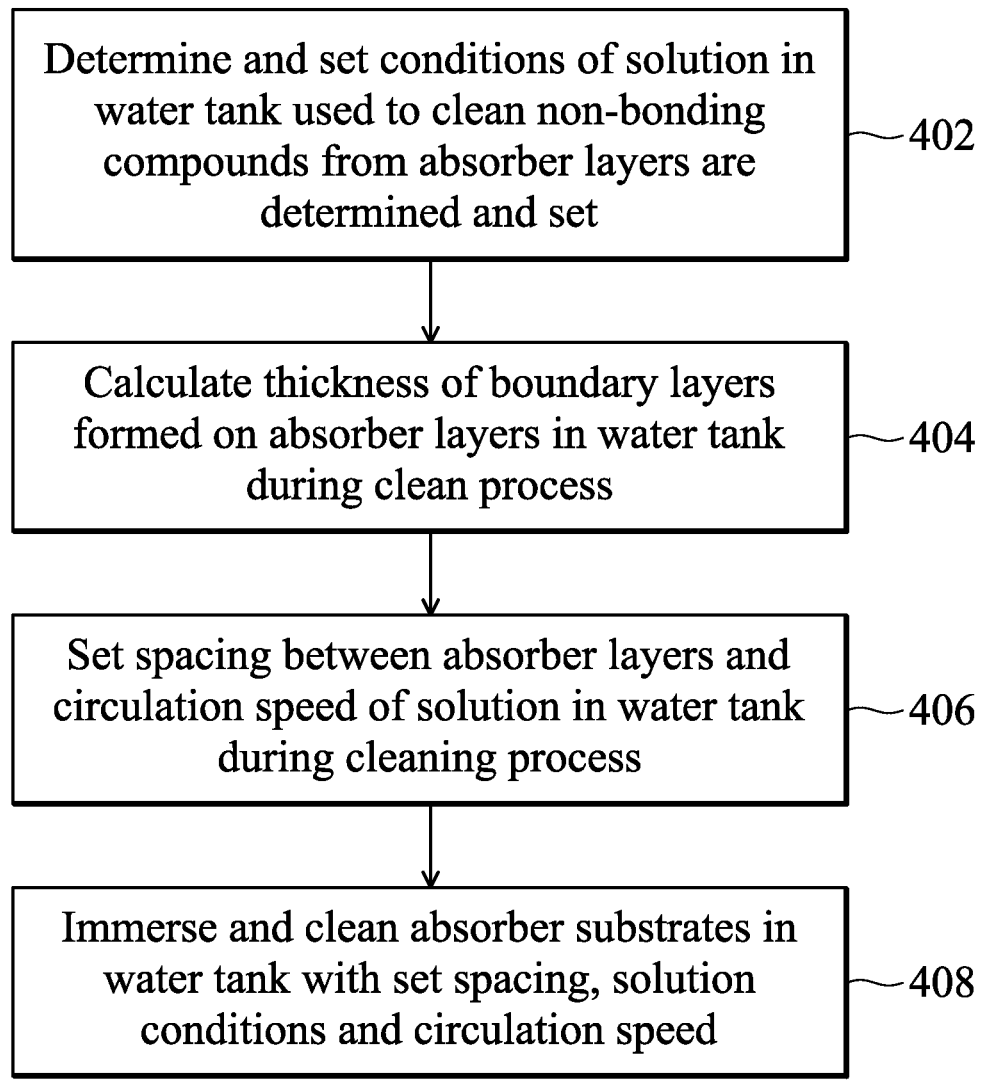
FIG. 4 is a flow chart of an example of a cleaning process that removes non-bonding compounds from the polycrystalline materials of the absorber layers in a plurality of absorber substrates, in accordance with some embodiments.

FIG. 4 is a flow chart 400 of an example of a cleaning process that removes non-bonding compounds from the polycrystalline materials of the absorber layers in a plurality of solar absorber substrates.

At step 402, a plurality of conditions of a solution in a water tank used to clean non-bonding compounds from absorber layers of a plurality of absorber substrates during fabrication are determined and set.

At step 404, thickness of boundary layers formed on each of the absorber layers are calculated based on hydrodynamics of the solution in the water tank during the clean process.

At step 406, one or more of spacing between the absorber substrates and circulation speed of the solution in the water tank during the cleaning process are set.

At step 408, the plurality of absorber substrates are immersed in the water tank with the set spacing and cleaned with the solution under the set conditions and circulation speed.

The approach described herein can be applied to absorber layers of panels of a variety of types, including but not limited to, CIGS, CdTe, CIS, CGS, CIGSS, amorphous silicon and the like. By properly setting the conditions of the solutions as well as fluid hydrodynamics of the water tank used for cleaning the unfinished solar cells, the disclosed approach is able to effectively extract and remove the undesired non-bonding compounds from grain boundaries of polycrystalline material of the absorber layers of the solar panels at fast reaction rate.

In some embodiments, the method of calculating the spacing between substrates and setting the spacing relationship of the substrates is automated. As shown in FIG. 3, the relevant input parameters described above ($\rho$, $\mu$, $u_0$, L) are input to a computer or microcontroller 200. In some embodiments, the fluid temperature is input or measured, and the viscosity $\mu$ is calculated by the computer 200 (or interpolated from nearest values in a viscosity table corresponding to the solvent being used). The computer or microcontroller 200 then calculates the desired spacing according to the above equations. The computer or microcontroller 200 transmits signals to one or more actuators 210 which control the position of each substrate. The actuators 210 move the substrates until the calculated spacing is achieved.

In some embodiments, the temperature and circulation speed are monitored during cleaning, and either the temperature, flow circulation speed $u_0$, or spacing between substrates is adjusted during immersion to maintain turbulent flow. For example, the computer or microcontroller 200 can calculate the Reynolds number $Re_x$, and adjust viscosity (by changing adding solvent and/or changing the temperature) or flow circulation speed to maintain a Reynolds number $Re_x > 1400$ at all times.

In some embodiments, if the calculated spacing is greater than a predetermined maximum desired spacing, the computer 200 calculates an increased flow circulation speed $u_0$ or reduced viscosity that permits separation of the boundary layers while the spacing limited to the predetermined maximum value.

In some embodiments, a method for removing a non-bonding compound from an absorber layer of an absorber substrate during a cleaning process comprises setting one or more conditions of a solution in a solvent tank used to clean the non-bonding compounds from the absorber layer of the absorber substrate. The method further comprises calculating thickness of a boundary layer formed on the absorber layer in the solvent tank during the cleaning process, and setting circulation speed of the solution in the solvent tank during the cleaning process. The method further comprises immersing and cleaning the absorber substrate in the solvent tank under the set conditions and circulation speed of the solution.

In some embodiments, a method for removing non-bonding compounds from respective absorber layers of each of a plurality of absorber substrates during a cleaning process comprises setting one or more conditions of a solution in a solvent tank used to clean the non-bonding compounds from the absorber layers of the absorber substrates. The method further comprises calculating a thickness of boundary layers formed on the absorber layers in the solvent tank during the cleaning process, and setting one or more of spacing between the absorber substrates and circulation speed of the solution in the solvent tank during the cleaning process. The method further comprises immersing and cleaning the absorber substrates in the solvent tank under one or more of the set conditions, spacing and circulation speed of the solution.

In some embodiments, a system for system for removing non-bonding compounds from respective absorber layers of each of a plurality of absorber substrates during a cleaning process comprises a solution in a tank, wherein one or more conditions of the solution are configured for cleaning the non-bonding compounds from the absorber layers of the absorber substrates. The system further comprises said tank configured to enable the absorber substrates to be immersed and cleaned in the tank during the cleaning process, wherein spacing between the solar absorber substrates and circulation speed of the solution in the tank are set during the cleaning process according to thickness of boundary layers formed on the absorber layers.

The methods and system described herein may be at least partially embodied in the form of computer-implemented processes and apparatus for practicing those processes. The disclosed methods may also be at least partially embodied in the form of tangible, non-transitory machine readable storage media encoded with computer program code. The media may include, for example, RAMs, ROMs, CD-ROMs, DVD-ROMs, BD-ROMs, hard disk drives, flash memories, or any other non-transitory machine-readable storage medium, wherein, when the computer program code is loaded into and executed by a computer, the computer becomes an apparatus for practicing the method. The methods may also be at least partially embodied in the form of a computer into which computer program code is loaded and/or executed, such that, the computer becomes a special purpose computer for practicing the methods. When implemented on a general-purpose processor, the computer program code segments configure the processor to create specific logic circuits. The methods may alternatively be at least partially embodied in a digital signal processor formed of application specific integrated circuits for performing the methods.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method for removing a non-bonding compound from an absorber layer of an absorber substrate during a cleaning process, comprising:
    setting one or more conditions of a solution in a solvent tank used to clean the non-bonding compounds from the absorber layer of the absorber substrate;
    calculating thickness of a boundary layer formed on the absorber layer in the solvent tank during the cleaning process;
    setting circulation speed of the solution in the solvent tank during the cleaning process; and
    immersing and cleaning the absorber substrate in the solvent tank under the set conditions and circulation speed of the solution.

2. The method of claim 1, wherein:
    the non-bonding compounds are formed at grain boundaries of polycrystalline material of the absorber layer of the absorber substrate during fabrication of the absorber substrate.

3. The method of claim 2, wherein:
the absorber layer comprises one of copper indium gallium selenide (CIGS) cadmium telluride (CdTe), CuInSe$_2$ (CIS), CuGaSe$_2$ (CGS), Cu(In,Ga)(Se,S)$_2$ (CIGSS), and amorphous silicon.

4. The method of claim 1, wherein:
the absorber substrate is an unfinished solar cell with the absorber layer uncovered and exposed for cleaning.

5. The method of claim 1, wherein:
the one or more conditions of the solution include content, pH value, and temperature of the solution.

6. The method of claim 5, further comprising:
setting pH value of the solution between the range of 4 to 12.

7. The method of claim 5, further comprising:
setting temperature of the solution between the range of 25° C.-85° C.

8. The method of claim 5, further comprising:
adding one or more solvent into the solution so as to reduce viscosity of the solution.

9. The method of claim 1, further comprising:
increasing the circulation speed of the solution to reduce the thickness of boundary layer thickness and increase flow speed of the solution.

10. A method for removing non-bonding compounds from respective absorber layers of each of a plurality of absorber substrates during a cleaning process, comprising:
setting one or more conditions of a solution in a solvent tank used to clean the non-bonding compounds from the absorber layers of the absorber substrates;
calculating a thickness of boundary layers formed on the absorber layers in the solvent tank during the cleaning process;
setting one or more of spacing between the absorber substrates and circulation speed of the solution in the solvent tank during the cleaning process; and
immersing and cleaning the absorber substrates in the solvent tank under one or more of the set conditions, spacing and circulation speed of the solution.

11. The method of claim 10, further comprising:
arranging the plurality of absorber substrates in pairs, wherein the absorber substrates in each pair are immersed in the solution with their respective absorber layers facing each other.

12. The method of claim 11, further comprising:
setting the spacing between the pair of absorber substrates based on the thickness of the boundary layers formed on the absorber substrates to speed up the cleaning process.

13. The method of claim 12, further comprising:
setting the spacing between the pair of absorber substrates to be greater than twice the thickness of the boundary layers on the absorber substrates.

14. The method of claim 11, further comprising:
setting the spacing between the pair of absorber substrates based on length of the absorber substrates.

* * * * *